US008421666B2

(12) United States Patent
Pedersen

(10) Patent No.: US 8,421,666 B2
(45) Date of Patent: Apr. 16, 2013

(54) ANALOG TO DIGITAL CONVERTER WITH ADJUSTABLE CONVERSION WINDOW

(75) Inventor: Trond Pedersen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 67 days.

(21) Appl. No.: 13/208,234

(22) Filed: Aug. 11, 2011

(65) Prior Publication Data
US 2013/0038481 A1   Feb. 14, 2013

(51) Int. Cl.
H03M 1/12 (2006.01)

(52) U.S. Cl.
USPC ............... 341/172; 341/33; 341/34; 341/155; 345/173

(58) Field of Classification Search .................. 341/172, 341/155, 34, 33; 345/173
See application file for complete search history.

(56) References Cited

U.S. PATENT DOCUMENTS

| | | | |
|---|---|---|---|
| 6,166,367 A * | 12/2000 | Cho | 250/208.1 |
| 6,587,143 B1 * | 7/2003 | Boisvert | 348/241 |
| 7,663,607 B2 | 2/2010 | Hotelling | |
| 7,875,814 B2 | 1/2011 | Chen | |
| 7,920,129 B2 | 4/2011 | Hotelling | |
| 7,948,477 B2 * | 5/2011 | Hotelling | 345/173 |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2009/0315854 A1 | 12/2009 | Matsuo | |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |

FOREIGN PATENT DOCUMENTS
WO   WO 2012/129247   9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

Primary Examiner — Khai M Nguyen
(74) Attorney, Agent, or Firm — Baker Botts LLP

(57) ABSTRACT

In one embodiment, an apparatus includes a first capacitor system and a second capacitor system. Each capacitor system comprises one or more engaged capacitors from respective pluralities of selectively engagable capacitors. The first capacitor system and second capacitor system are respectively selectively coupled to a first reference voltage and a second reference voltage. The apparatus further includes a switch configured to transfer charge between the first capacitor system and the second capacitor system when the switch is closed such that the first capacitor system and the second capacitor system each store the same first voltage. The apparatus further includes a node coupled to the first capacitor system, the second capacitor system, and a first input of a differential amplifier of an analog to digital converter. The node is configured to bias the differential amplifier to the first voltage.

21 Claims, 5 Drawing Sheets

ANALOG TO DIGITAL CONVERTER WITH ADJUSTABLE CONVERSION WINDOW

TECHNICAL FIELD

This disclosure generally relates to analog to digital conversion.

BACKGROUND

An analog to digital converter (ADC) is a device that converts a continuous quantity to a discrete time digital representation. For example, an ADC may be an electronic device that converts an input analog voltage or current to a digital number proportional to the magnitude of the voltage or current. Typically, an ADC has a range of voltages that it can convert into unique digital codes. This range of voltages is called a conversion window. The ADC also has a resolution that defines the number of bits in each digital code.

DESCRIPTION OF EXAMPLE EMBODIMENTS

Figure 1:
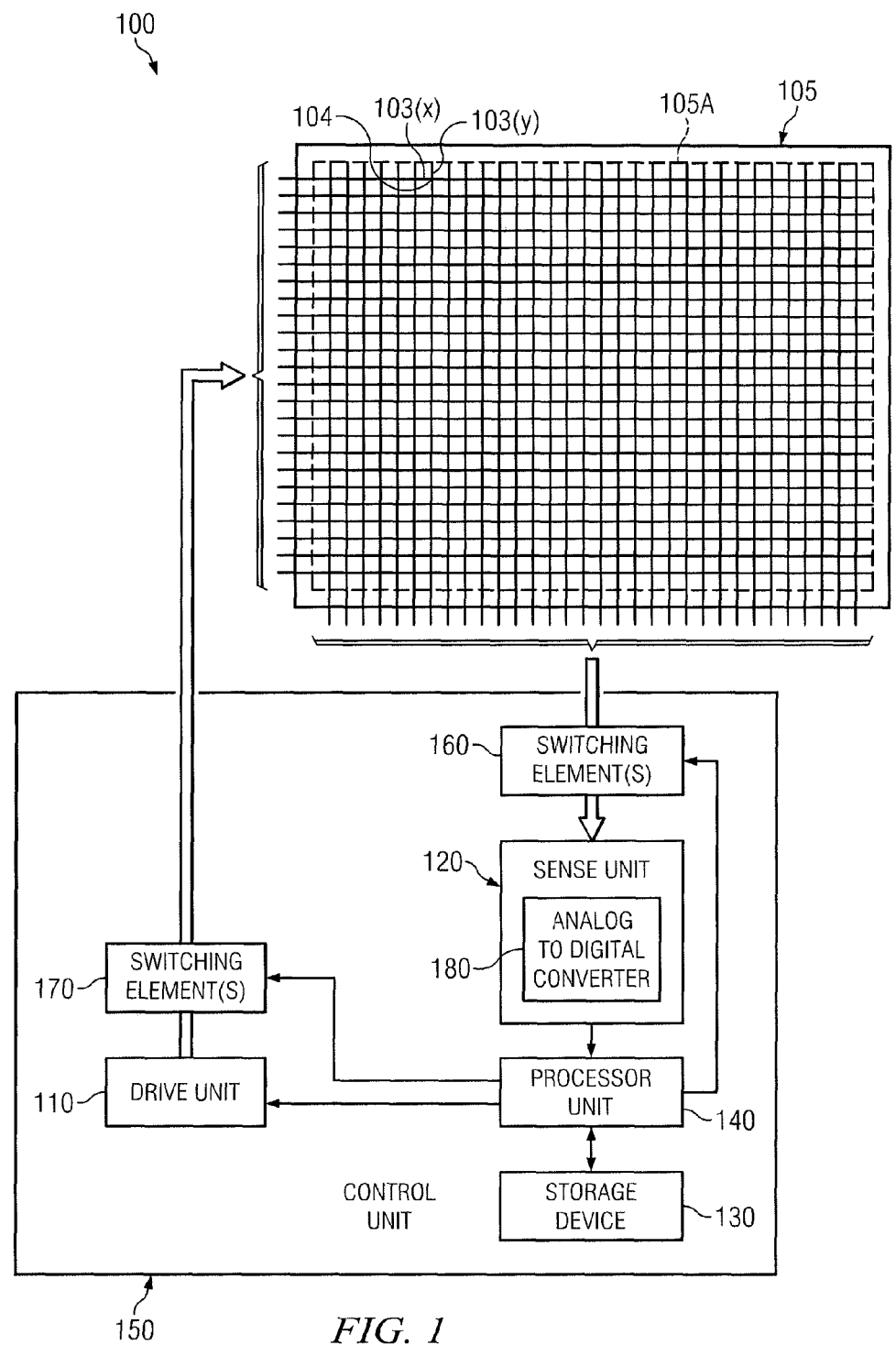
FIG. 1 illustrates an example system comprising a capacitive touch sensor coupled to a control unit that includes an analog to digital converter (ADC).

FIG. 1 illustrates an example of a system 100 comprising a capacitive touch sensor 105 coupled to a control unit 150 that includes an analog to digital converter (ADC) 180. Capacitive touch sensor 105 of system 100 may include a screen comprising an insulator coated with a transparent conductor in a particular pattern. When a finger or other object touches the surface of the screen, there is a change in capacitance. A signal indicating this change in capacitance may be sent to control unit 150 for processing to determine the position of the touch. In various embodiments, system 100 is operable to process measurements of any suitable type of capacitance, such as surface capacitance, projected capacitance, mutual capacitance, and self or absolute capacitance.

As depicted, capacitive touch sensor 105 includes sensing area 105A. Drive electrodes 103(x) and sense electrodes 103(y) may be formed in the sensing area 105A on one or more substrates. As depicted, the drive electrodes 103(x) run in a horizontal direction and the sense electrodes 103(y) run in a vertical direction. However, the sense and drive electrodes may have any suitable shape and arrangement. Capacitive sensing channels 104 may be formed in the sensing area at the regions where edges of the drive electrodes 103(x) and sense electrodes 103(y) are adjacent. In certain embodiments, drive electrodes 103(x) and sense electrodes 103(y) are arranged in electrical isolation from each other. For example, the drive electrodes 103(x) and the sense electrodes 103(y) of capacitive touch sensor 105 may be arranged on opposite surfaces of an insulating substrate so that the substrate provides electrical isolation between the drive and sense electrodes.

The control unit 150 of system 100 may be in communication with the capacitive touch sensor 105. As depicted, the control unit 150 includes a drive unit 110, a sense unit 120, a storage device 130, and a processor unit 140. The storage device 130 may store programming in a computer-readable storage medium for execution by the processor unit 140 and data used in or resulting from operations of the processor unit 140. In some embodiments, the control unit 150 is an integrated circuit chip such as a general purpose microprocessor, a microcontroller, a programmable logic device/array, an application-specific integrated circuit (ASIC), or a combination thereof. In other embodiments, the drive unit 110, the sense unit 120, and/or the processor unit 140 may be provided in separate control units.

The processor unit 140 controls the drive unit 110 to supply drive signals (such as electrical pulses) to the drive electrodes 103(x), so as to induce charge on the sense electrodes 103(y) that intersect with the drive electrodes 103(x). The sense unit 120 senses charge at the various intersections 104 via the sense electrodes 103(y), and the sense unit 120 provides measurement signals representing node capacitance to the processor unit 140. In the embodiment depicted, sense unit 120 includes one or more analog to digital converters (ADCs) 180 operable to convert the signals representing node capacitance to digital values that are sent to processor unit 140.

In the embodiment depicted, the drive electrodes 103(x) connect to the drive unit 110 via one or more first switching elements 170 and the sense electrodes 103(y) connect to the sense unit 120 via one or more second switching elements 160. The switching elements 160 and 170 are controlled by the processor unit 140. In a particular embodiment, the processor unit 140 controls the switching elements 160 and 170 and the drive and sense units 110 and 120 to implement sensing at all of the intersections 104 on the sensing area 105A and provide full sensing resolution. Each drive electrode 103(x) may be driven, and signals from each sense electrode 103(y) may be sensed. In a different embodiment, the processor unit 140 controls the switching elements 160 and 170 and the drive and sense units 110 and 120 to drive and sense via a smaller number of channels. Selected subsets of the drive and sense electrodes may be used. In this example, the drive signals are applied to groups of drive electrodes 103(x) forming a smaller number of drive channels, and signals are sensed from groups of sense electrodes 103(y) forming a smaller number of sense channels.

In a particular embodiment, the processor unit 140 is capable of processing data received from the sense unit 120 and determining the presence and location of a touch on the capacitive touch sensor 105. In a particular embodiment, the presence and location of a touch on the capacitive touch sensor 105 may be determined by detecting a change in capacitance of one or more capacitive sensing channels 104 of the capacitive touch sensor. In some embodiments, the capacitance of one or more capacitive sensing channels 104 may be sampled periodically in order to determine whether the capacitances of the channels have changed. In some embodiments, the capacitance of one or more capacitive sensing channels 104 is sampled by ADC 180.

In some embodiments, a charge indicative of a capacitance of a capacitive sensing channel 104 may be stored by one or more capacitors and converted to a digital value by ADC 180. In certain embodiments, all or a portion of ADC 180 may reside within control unit 150. In particular embodiments, all or a portion of ADC 180 resides within sense unit 120.

The performance of ADC 180 may be characterized in part by its conversion window and its resolution. The conversion window is the range of values that ADC 180 can convert into unique digital binary codes. For example, ADC 180 may have a conversion window of 0 to 10 volts for performing a digital conversion of a single-ended analog voltage. If the input voltage is below 0 volts, the ADC 180 will output the same code as for 0 volts, and if the input voltage is above 10 volts, the ADC 180 will output the same code as for 10 volts. The resolution of an ADC 180 is the number of bits in the digital output code. For example, ADC 180 may have a resolution of 10 bits. Accordingly, the ADC 180 may be capable of producing $2^{10}=1024$ unique digital codes over the range of the conversion window. The voltage step in between successive codes can be defined by the conversion window size divided by the number of unique digital codes. In this example, the voltage step between each successive code is (10 volts−0 volts)/1024=9.766 millivolts. Thus, an input voltage of approximately 10 millivolts may result in an output code of 0000000001 and an input voltage of approximately 20 millivolts may result in an output code of 0000000010. However, in order to generate a unique output code for an input voltage of 15 millivolts, the step size of the ADC 180 would have to decrease. This can be done by increasing the resolution of the ADC 180. However, adding even one bit of resolution to the ADC 180 can greatly increase the area of the ADC 180. Another way to decrease the step size of the ADC 180 is to decrease the size of the conversion window, while maintaining the same resolution. This leads to a gain in the effective resolution of the ADC 180. For example, if the conversion window in the example above was decreased to 0 to 5 volts, the step size would be approximately 5 mV, and the effective resolution over the new conversion window would be 11 bits instead of 10. However, if the expected input voltage is 6 volts, the ADC 180 would have to be biased to accurately perform the conversion. For example, if the desired conversion window was 5 to 10 volts, the ADC 180 could be biased to 5 volts, thus enabling the measurement of signals between 5 and 10 volts with an effective resolution of 11 bits.

In typical ADC systems, resolution may be effectively increased by coupling one input of a differential ADC to a digital to analog converter (DAC), lifting this input to a voltage close to the voltage that will be measured, and reducing a reference voltage to narrow the conversion window of the ADC. However, the DAC requires the area needed for the circuit and the power dissipated by the circuit.

In some embodiments, ADC 180 includes a first capacitor system having a variable capacitance. The first variable capacitance is based, at least in part, upon a number of engaged capacitors of a first plurality of selectively engagable capacitors. The first capacitor system may be selectively coupled to a first reference voltage. ADC 180 may also include a second capacitor system having a variable capacitance. The second variable capacitance is based, at least in part, upon a number of engaged capacitors of a second plurality of selectively engagable capacitors. The second capacitor system may be selectively coupled to a second reference voltage. ADC 180 further includes a switch coupled to the first capacitor system and the second capacitor system. The switch is configured to transfer charge between the first capacitor system and the second capacitor system when the switch is closed such that the first capacitor system and the second capacitor system each store the same first voltage. The first voltage is less than the first reference voltage. ADC 180 may also comprise a node coupled to the first capacitor system, the second capacitor system, and a first input of a differential amplifier of an analog to digital converter. The node is configured to bias the differential amplifier to the first voltage. The biasing, along with a conversion window resizing technique, may be used to zoom in on a desired portion of the conversion window of ADC 180 and effectively increase the resolution of an analog to digital conversion performed by ADC 180. In some embodiments, ADC 180 is a differential ADC and the bias voltage is coupled to one input of the differential ADC. ADC 180 may then perform the digital conversion of a single-ended input voltage.

Figure 2:
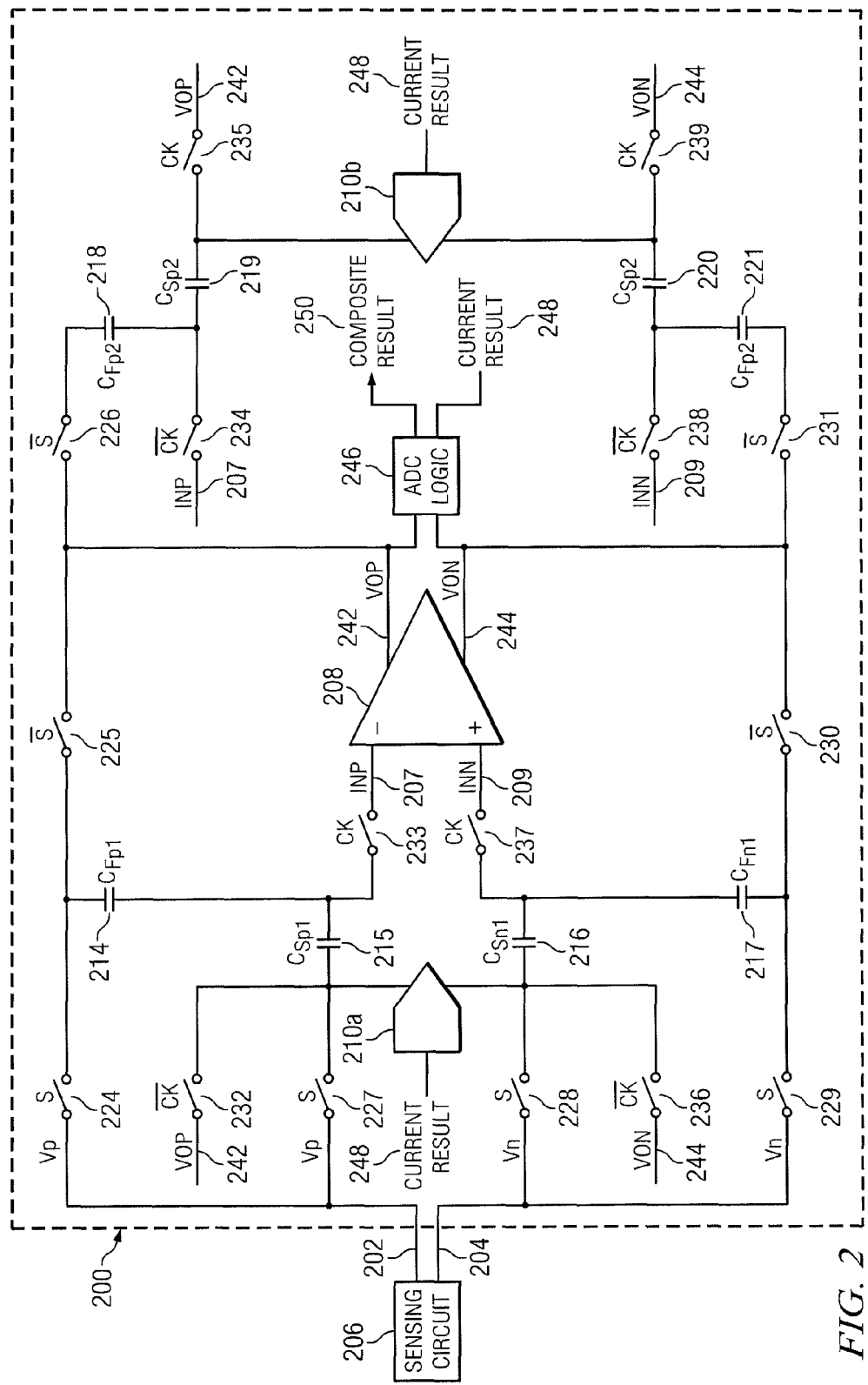
FIG. 2 illustrates an embodiment of the ADC of FIG. 1 comprising a differential algorithmic ADC.
Figure 4:
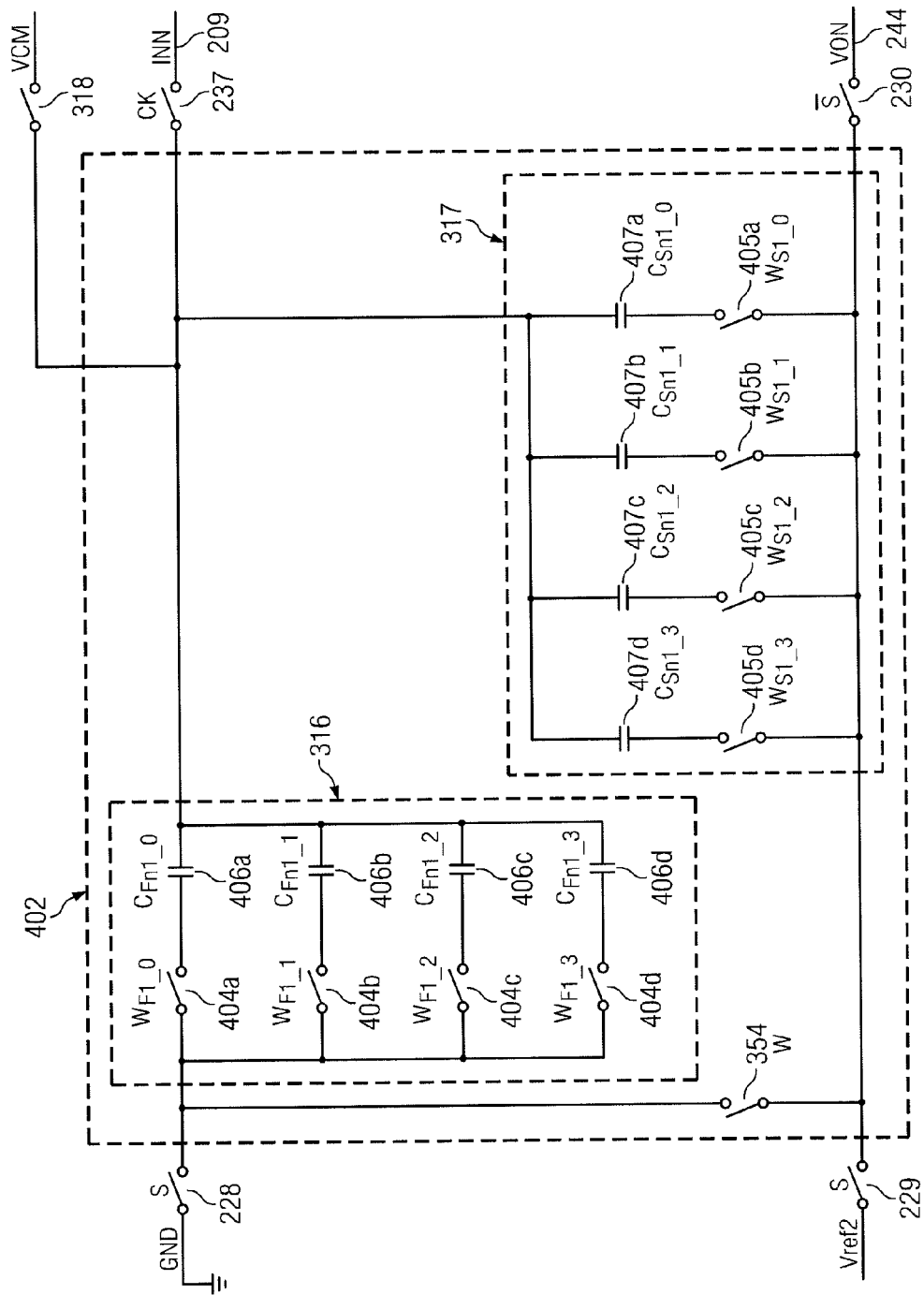
FIG. 4 is an example embodiment of the capacitor based biasing circuit of the ADC of FIG. 3.
Figure 5:
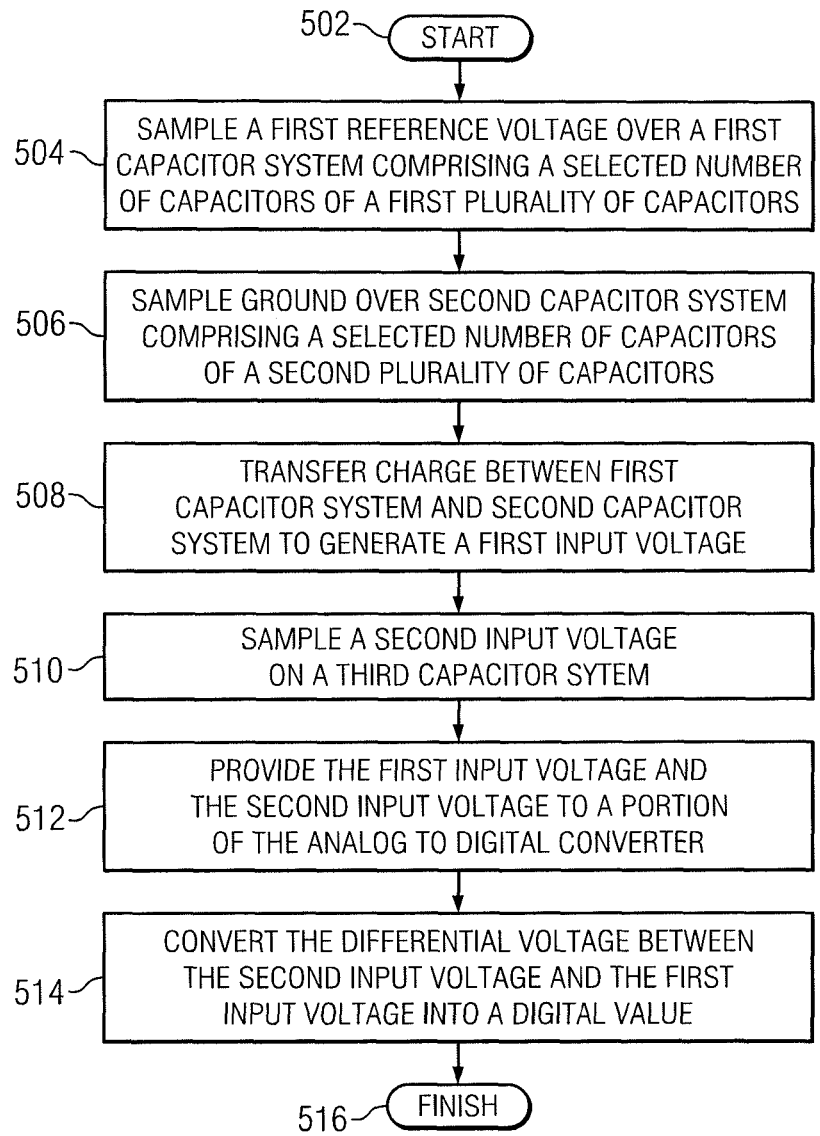
FIG. 5 is a method for adjusting a conversion window of the ADC of FIG. 1.

FIG. 2 illustrates an embodiment 200 of ADC 180 that includes a differential algorithmic ADC. According to the teachings of the invention, the embodiment shown in FIG. 2 may be modified to include a capacitor based biasing circuit as described above to yield the embodiment of ADC 180 shown in FIG. 3 which provides for an adjustable window. FIG. 4 provides an example embodiment of the capacitor based biasing circuit of FIG. 3. FIG. 5 illustrates a method for adjusting a conversion window of ADC 180.

FIG. 2 illustrates an embodiment of ADC 180 comprising a differential algorithmic ADC, referred to here as ADC 200. Although ADC 200 is shown as an algorithmic ADC, ADC 180 may be any suitable differential ADC type, such as flash, successive-approximation, integrating, pipeline, sigma-delta, or other suitable ADC type. ADC 200 may be used to convert a differential input voltage into a digital value.

ADC 200 comprises digital to analog converters (DACs) 210, differential amplifier 208, ADC logic 246, capacitors 214-221, and switches 224-239. ADC 200 may be coupled to sensing circuit 206. In some embodiments, sensing circuit 206 may be located within control unit 150, though it is not explicitly shown in FIG. 1. Sensing circuit 206 may comprise any suitable circuitry for transmission of a first signal to capacitors 214 and 215 via switches 224 and 227 respectively and a second signal to capacitors 216 and 217 via switches 228 and 229 respectively. As an example, sensing circuit 206 may comprise one or more receive pads, amplifiers, inverters, transmission lines, or other suitable circuitry. In a particular embodiment, sensing circuit 206 is coupled to a capacitive sensing channel 104 of a capacitive touch sensor 105 and is configured to transmit signals that are indicative of a capacitance of an area of the capacitive touch sensor 105 (such as capacitive sensing channel 104) to the capacitors 214-217.

During a sampling phase, switches 224, 227, 228 and 229 are closed and charge is transferred between capacitors 214-217 and sensing circuit 206. This charge transfer will result in a first voltage drop across capacitors 214 and 215 and a second voltage drop across capacitors 216 and 217. After the sampling phase is complete, switches 224, 227, 228, and 229 are opened, switches 225, 226, 230, and 231 are closed, and conversion of the differential voltage comprising a difference between the first voltage drop and the second voltage drop begins.

In the embodiment depicted, differential amplifier 208 is configured to have a unity gain during the conversion phase (i.e., the output of the amplifier is the same as the input). In a first cycle, a clock signal CK is active and closes switches 233, 237, 235, and 239. The voltage across capacitors 214 and 215 is received at amplifier 208, output on connection 242, and stored at capacitors 218 and 219. Similarly, the voltage across capacitors 216 and 217 is received at amplifier 208, output on connection 244, and stored at capacitors 220 and 221. ADC logic 246 senses the output differential voltage (between 242 and 244) and generates a current result 248 based on the differential voltage. The current result 248 is stored as a portion of the composite result 250. The current result 248 is received at DAC 210*b* and DAC 210*b* generates a signal based on the current result 248 and the generated signal is added to the differential voltage stored by capacitors 218-221, thus producing an intermediate result that is stored in these capacitors. In one embodiment, DACs 210 are 1.5 bit DACs operable to output a reference voltage, a negative amount of the reference voltage, or ground. The CK signal is then deactivated, switches 233, 237, 235, and 239 are opened, and the first cycle ends.

The second cycle begins as a $\overline{CK}$ signal is activated and switches 232, 234, 236, and 238 are closed. The voltage across capacitors 218 and 219 is received at amplifier 208, output on connection 242, and stored at capacitors 214 and 215. Similarly, the voltage across capacitors 220 and 221 is received at amplifier 208, output on connection 244, and stored at capacitors 216 and 217. ADC logic 246 senses the output differential voltage (between 242 and 244) and generates a second current result 248 based on the differential voltage. The current result 248 is stored as a second portion of the composite result 250. The current result 248 is received at DAC 210a and DAC 210a generates a signal based on the current result 248 and the generated signal is added to the differential voltage stored by capacitors 214-217. The $\overline{CK}$ signal is deactivated, switches 232, 234, 236, and 238 are opened, and the second cycle ends. Subsequent cycles are performed in a similar manner until the composite result represents a digital value of the initial input voltage.

ADC 200 may be characterized in part by a conversion window. The conversion window is the range of values that ADC 200 can convert into unique digital binary codes. For example, ADC 200 may have a conversion window of 0 to 10 volts for performing a digital conversion of a single-ended analog voltage. In some embodiments, the conversion window of ADC 200 may be adjusted by shifting the conversion window through biasing the ADC and/or changing one or more reference voltages of the ADC to decrease the size of the conversion window.

Figure 3:
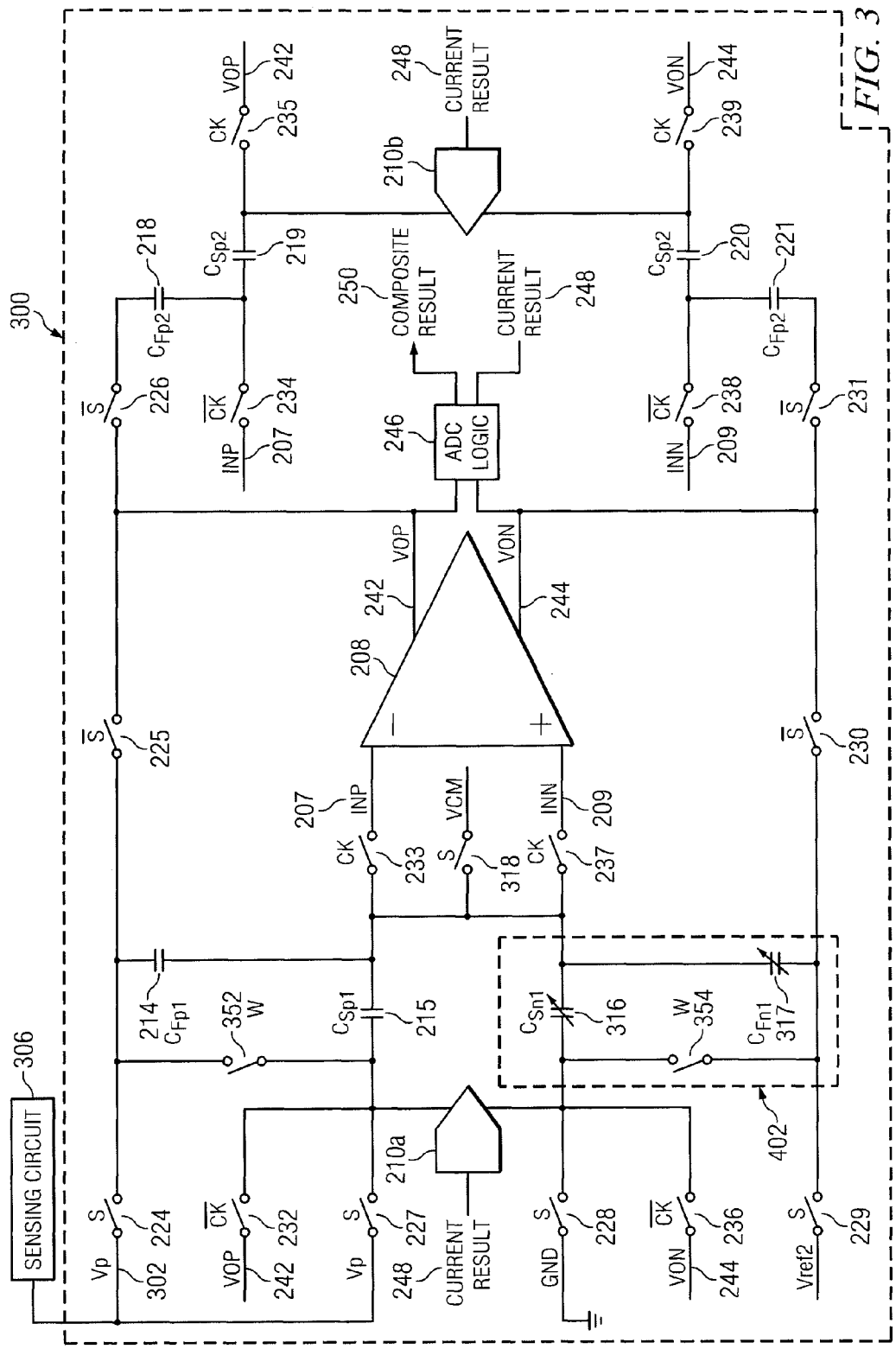
FIG. 3 illustrates another embodiment of the ADC of FIG. 1 comprising an ADC with an adjustable conversion window.

FIG. 3 illustrates another embodiment 300 of ADC 180. ADC 300 is operable to provide an adjustable conversion window. The structure of ADC 300 is largely similar to that of ADC 200, however, system 300 comprises a biasing circuit 402 in the place of capacitors 216 and 217 of ADC 200. Although, the ADC 300 is shown as an algorithmic ADC, the biasing circuit 402 of ADC 300 may be used with (e.g., may be coupled to an input of) any suitable differential ADC, such as a flash ADC, successive-approximation ADC, integrating ADC, pipeline ADC, sigma-delta ADC, or other suitable ADC.

Sensing circuit 306 is similar to sensing circuit 206, except that sensing circuit 306 provides a single-ended voltage to capacitors 214 and 215, rather than the differential voltage provided by sensing circuit 206. Biasing circuit 402 is operable to set a limit of the conversion window of the ADC of system 300, such as the lower limit. Biasing circuit 402 comprises capacitor systems 316 and 317 and switch 354. Each capacitor system may comprise one or more capacitors. In the embodiment depicted, capacitor system 317 is coupled to a reference voltage Vref2 via switch 229. Vref2 may be any suitable voltage source. In a particular embodiment, Vref2 is a direct current (DC) voltage source. In the embodiment depicted, capacitor system 316 is coupled to ground (GND) via switch 228. In other embodiments, capacitor system 316 may be coupled to a reference voltage other than ground, such as a DC voltage source with a level that is lower than the level of Vref2.

During a sampling phase, switches 224, 227-229, and 318 are closed. This couples sensing circuit 306 to capacitors 214 and 215, voltage VCM to capacitors 214 and 215 and capacitor systems 316 and 317, Vref2 to capacitor system 317, and GND to capacitor system 316. Charge may be transferred between capacitors 214 and 215 and sensing circuit 306 as the capacitors sample Vp. This charge transfer will result in a first voltage drop equal to Vp−VCM across each of the capacitors 214 and 215. At the same time, capacitor system 317 samples Vref2 resulting in a voltage drop of Vref2−VCM over capacitor system 317. Capacitor system 316 samples GND resulting in a voltage drop of VCM−0=VCM over capacitor system 316.

Switches 352 and 354 are then closed, resulting in a charge transfer between capacitors 214 and 215 such that there is an equal voltage drop (Vp) across each capacitor. This also results in a charge transfer between capacitor systems 316 and 317 such that there is an equal voltage drop across each capacitor system. The voltage drop across each of the capacitor systems is the bias voltage ($V_{bias}$) that amplifier 208 will receive during the first cycle of conversion by the ADC. After a sufficient time for the transfer of charge to complete, the sampling phase ends, switches 224, 227-229, 318, 352, and 354 are opened, and conversion of Vp to a digital value begins. The conversion occurs in a manner similar to that described above with respect to ADC 200 of FIG. 2. During conversion, capacitor systems 316 and 317 perform the function of capacitors 216 and 217 described above. This configuration results in a digital to analog conversion of a single-ended voltage (Vp) within a conversion window with a lower limit equal to the biasing voltage stored by capacitor systems 316 and 317.

After the bias voltage is generated, the conversion window size of the ADC of system 300 may be decreased by decreasing one or more reference voltages that are coupled to components of the ADC, such as DACs 210 and/or differential amplifier 208. In a particular embodiment, a fraction of the reference voltage Vref2 may be provided to one or more components of system 300 to decrease the conversion window size of the ADC and enable analog to digital conversion at an increased effective resolution.

Thus, ADC 300 is operable to provide an adjustable conversion window. A bias circuit 402 may provide a biasing voltage that shifts the lower limit of the conversion window and one or more voltage references of ADC 300 may be decreased to reduce the conversion window size of ADC 300. After the conversion window is adjusted, an input voltage may be converted by ADC 300 to a digital value at an effective resolution that is greater than the physical resolution of the ADC.

FIG. 4 is an example embodiment of the capacitor based biasing circuit 402 of FIG. 3. In the embodiment depicted, biasing circuit 402 comprising capacitor systems 316 and 317. As shown, capacitor system 316 includes switches 404a-404d and capacitors 406a-406d and capacitor system 317 includes switches 405a-405d and capacitors 407a-407d. For purposes of illustration herein, capacitors 404 and 405 are assumed to be of equal size, however other embodiments may include capacitors of different sizes. In some embodiments, capacitors 404 may include capacitors of more than one size. Similarly, in some embodiments, capacitors 405 may include capacitors of more than one size. Particular embodiments may include more or fewer capacitors, switches, or other components in each capacitor system 316 or 317.

Biasing circuit 402 is operable to produce a bias voltage ($V_{bias}$) that may be coupled to an input of an ADC. The bias voltage is dynamically adjustable, based on how many capacitors 406 and 407 of capacitor systems 316 and 317 are engaged. In the embodiment depicted, a capacitor 406 is engaged if it is configured to sample GND during at least a portion of the sampling phase. Similarly, a capacitor 407 is engaged if it is configured to sample Vref2 during at least a portion of the sampling phase. In some embodiments, a capacitor 406 is engaged by closing a switch 404 that is coupled in series to the capacitor 406. For example, capacitor 406a may be configured to sample GND by closing switch 404a. Similarly, In some embodiments, a capacitor 407 is engaged by closing a switch 405 that is coupled in series to the capacitor 407. For example, capacitor 407a may be configured to sample Vref2 by closing switch 405a. In some embodiments, if a capacitor 406 or 407 is not engaged, a switch 404 or 405 in series with the capacitor is left open. In various embodiments, the numbers of capacitors 406 and 407 that are engaged are based upon an expected input voltage of ADC 180.

For purposes of illustration, it will be assumed that for a particular conversion of an input voltage, N capacitors 407 are engaged, and M capacitors 406 are engaged. After the desired number of capacitors 406 and 407 are engaged, the engaged capacitors 406 sample GND and the engaged capacitors 407 sample Vref2. As they sample their respective voltages, one side of each engaged capacitor 406 and 407 is coupled to a voltage VCM via switch 318. This results in a voltage drop of Vref2−VCM over each engaged capacitor 407 and a voltage drop of VCM−0=VCM over each engaged capacitor 406. While VCM may be any suitable voltage, for purposes of illustration it will be assumed that VCM=0. Thus, each engaged capacitor 407 has a voltage drop of Vref2, and each engaged capacitor 406 has a voltage drop of 0. At this point, the amount of charge stored in capacitor system 316 is approximately zero and the amount of charge stored in capacitor system 317 is approximately N*C*Vref, where C is the capacitance of each engaged capacitor 407.

Switch 354 is then closed, allowing charge to transfer from capacitor system 317 to capacitor system 316. Charge transfers between the two capacitor systems 316 and 317 until the voltage drop across each capacitor system is the same. This voltage drop is the bias voltage ($V_{bias}$) provided to an ADC, such as the ADC of system 300. Due to conservation of charge, the amount of charge in the two systems before switch 354 is closed and after switch 354 is closed is equal, thus $N*C*Vref2 = N*C*V_{bias} + M*C*V_{bias}$. Accordingly, $V_{bias} = (N/N+M)*Vref2$. By varying the values of N and M (i.e., by engaged different numbers of capacitors for operation), various fractional levels of Vref2 may be generated for the bias voltage. In this example, if Vref2 were equal to 10 V and 4 capacitors 407 and 2 capacitors 406 were engaged, the resulting bias voltage would be approximately 6.67 V. As another example, if one capacitor 407 and four capacitors 406 were engaged, the resulting bias voltage would be approximately 2 V. The level of the bias voltage may also be varied by changing other factors, such as the size of one or more capacitors in capacitor systems 316 or 317, the level of VCM, the level of Vref2, and (if a reference voltage other than GND is coupled to capacitor system 316 via switch 228) the level of that reference voltage. After the bias voltage is generated, switches 228, 229, 318, and 354 may be opened, and the bias voltage provided to an amplifier of an ADC, such as amplifier 208 of the ADC of system 300. The conversion window size of the ADC (such as the ADC of system 300) may also be decreased as discussed above, thus adjusting the conversion window and effectively raising the resolution of the ADC.

FIG. 5 is an example method for adjusting a conversion window of an ADC, such as ADC 180. The method begins at step 502. At step 504, a first reference voltage is sampled over a first capacitor system comprising a selected number of capacitors of a first plurality of capacitors. As an example, referring to FIG. 4, Vref2 may be sampled over one or more capacitors 407 of bias circuit 402. At step 506, ground is sampled over a second capacitor system comprising a selected number of capacitors of a second plurality of capacitors. As an example, GND may be sampled by one or more capacitors 406 of bias circuit 402. In some embodiments, a reference voltage other than ground may be sampled by the selected capacitors 406 of bias circuit 402.

At step 508, charge may be transferred between the first capacitor system and the second capacitor system to generate a first input voltage. For example, switch 354 of bias circuit 402 may be closed and charge may transfer between the engaged capacitors 406 and 407. This may result in an equal voltage drop across each of the engaged capacitors 406 and 407. Switch 354 may then be opened.

At step 510, a second input voltage is sampled on a third capacitor system. For example, as depicted in FIG. 3, Vp may be sampled by capacitors 214 and 215 when switches 224 and 227 are closed. At steps 512 and 514, the first input voltage and the second input voltage are provided to a portion of the ADC and the differential voltage between the second input voltage and the first input voltage is converted into a digital value. As an example, when switch 233 closes, the voltage across capacitors 214 and 215 is provided to the inverting input of differential amplifier 208 and the voltage across the two capacitor system 316 and 317 (i.e., the voltage drop across each engaged capacitor 406 and 407) is provided to the non-inverting input of the differential amplifier. In some embodiments, the conversion window size of the ADC of system 300 may then be decreased. Finally, the differential voltage across the inputs of amplifier 208 is converted by system 300 into a digital value.

Particular embodiments may provide one or more or none of the following technical advantages. Particular embodiments may provide an analog to digital converter with an adjustable conversion window. A bias circuit may provide a biasing voltage that shifts the lower limit of the conversion window. One or more voltage references may be decreased to reduce the conversion window size of the analog to digital converter. In particular embodiments, a voltage may be converted to a digital value at a resolution that is greater than the physical resolution of the ADC. Particular embodiments reduce the circuit area required to perform digital conversion at a particular resolution.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. An apparatus comprising:
a first capacitor system having a first variable capacitance, the first variable capacitance based, at least in part, upon a number of engaged capacitors of a first plurality of selectively engagable capacitors, the first capacitor system selectively coupled to a first reference voltage;
a second capacitor system having a second variable capacitance, the second variable capacitance based, at least in part, upon a number of engaged capacitors of a second plurality of selectively engagable capacitors, the second capacitor system selectively coupled to a second reference voltage;
a switch coupled to the first capacitor system and the second capacitor system, the switch configured to transfer charge between the first capacitor system and the second capacitor system when the switch is closed such that the first capacitor system and the second capacitor system each store the same first voltage, the first voltage less than the first reference voltage; and
a node coupled to the first capacitor system, the second capacitor system, and a first input of a differential amplifier of an analog to digital converter, the node configured to bias the differential amplifier to the first voltage.

2. The apparatus of claim 1, wherein:
the second reference voltage is a ground of the apparatus and the first voltage is equal to the product of the first reference voltage and the number of engaged capacitors of the first plurality of selectively engagable capacitors divided by the number of engaged capacitors of the second plurality of selectively engagable capacitors.

3. The apparatus of claim 1, wherein:
the analog to digital converter has a variable conversion window that increases in effective resolution as the size of the conversion window decreases.

4. The apparatus of claim 1, further comprising:
a third capacitor system coupled to a second input of the differential amplifier of the analog to digital converter and configured to store a second voltage.

5. The apparatus of claim 4, further comprising:
a sensing circuit operable to be coupled to a capacitive touch sensor and transfer an amount of charge that is indicative of a measured capacitance of an area of the capacitive touch sensor to the third capacitor system.

6. The apparatus of claim 4, wherein:
the analog to digital converter is configured to convert the second voltage to a digital value.

7. The apparatus of claim 4, wherein:
the first capacitor system and the second capacitor system are collectively operable to store an intermediate result of an analog to digital conversion of the second voltage.

8. A method comprising:
engaging a number of capacitors of a first capacitor system comprising a first plurality of selectively engagable capacitors;
engaging a number of capacitors of a second capacitor system comprising a second plurality of selectively engagable capacitors;
coupling the first capacitor system to a first reference voltage;
coupling the second capacitor system to a second reference voltage;
transferring charge between the first capacitor system and the second capacitor system such that the first capacitor system and the second capacitor system each stores the same first voltage, the first voltage less than the first reference voltage; and
biasing a differential amplifier of an analog to digital converter to the first voltage by a node coupled to the first capacitor system, the second capacitor system, and the differential amplifier.

9. The method of claim 8, wherein:
the second reference voltage is a ground of the apparatus and the first voltage is equal to the product of the first reference voltage and the number of engaged capacitors of the first plurality of selectively engagable capacitors divided by the number of engaged capacitors of the second plurality of selectively engagable capacitors.

10. The method of claim 8, further comprising:
increasing a resolution of the analog to digital converter by decreasing the size of a conversion window of the analog to digital converter.

11. The method of claim 8, further comprising:
storing a second voltage by a third capacitor system; and
coupling the third capacitor system to a second input of the differential amplifier of the analog to digital converter.

12. The method of claim 11, further comprising:
coupling a sensing circuit to a capacitive touch sensor; and
transferring an amount of charge that is indicative of a measured capacitance of an area of the capacitive touch sensor to the third capacitor system.

13. The method of claim 11, further comprising:
converting, by the analog to digital converter, the second voltage to a digital value.

14. The method of claim 11, further comprising:
storing, by the first capacitor system and the second capacitor system, an intermediate result of an analog to digital conversion of the second voltage.

15. An apparatus, comprising:
a capacitive touch sensor comprising a plurality of nodes; and
a control unit coupled to the capacitive touch sensor, the control unit comprising:
a first capacitor system having a first variable capacitance, the first variable capacitance based, at least in part, upon a number of engaged capacitors of a first plurality of selectively engagable capacitors, the first capacitor system selectively coupled to a first reference voltage;
a second capacitor system having a second variable capacitance, the second variable capacitance based, at least in part, upon a number of engaged capacitors of a second plurality of selectively engagable capacitors, the second capacitor system selectively coupled to a second reference voltage;

a switch coupled to the first capacitor system and the second capacitor system, the switch configured to transfer charge between the first capacitor system and the second capacitor system when the switch is closed such that the first capacitor system and the second capacitor system each store the same first voltage, the first voltage less than the first reference voltage; and a node coupled to the first capacitor system, the second capacitor system, and a first input of a differential amplifier of an analog to digital converter, the node configured to bias the differential amplifier to the first voltage.

16. The apparatus of claim 15, wherein:

the second reference voltage is a ground of the apparatus and the first voltage is equal to the product of the first reference voltage and the number of engaged capacitors of the first plurality of selectively engagable capacitors divided by the number of engaged capacitors of the second plurality of selectively engagable capacitors.

17. The apparatus of claim 15, wherein:

the analog to digital converter has a variable conversion window that increases in effective resolution as the size of the conversion window decreases.

18. The apparatus of claim 15, further comprising:

a third capacitor system coupled to a second input of the differential amplifier of the analog to digital converter and configured to store a second voltage.

19. The apparatus of claim 18, further comprising:

a sensing circuit coupled to the capacitive touch sensor and configured to transfer an amount of charge that is indicative of a measured capacitance of an area of the capacitive touch sensor to the third capacitor system.

20. The apparatus of claim 18, wherein:

the analog to digital converter is configured to convert the second voltage to a digital value by the analog to digital converter.

21. The apparatus of claim 18, wherein:

the first capacitor system and the second capacitor system are collectively operable to store an intermediate result of an analog to digital conversion of the second voltage.

* * * * *